United States Patent
Kobayashi et al.

(10) Patent No.: US 10,512,988 B2
(45) Date of Patent: Dec. 24, 2019

(54) COATED SOLDER MATERIAL AND METHOD FOR PRODUCING SAME

(71) Applicant: SUMITOMO METAL MINING CO., LTD., Tokyo (JP)

(72) Inventors: Hiroshi Kobayashi, Chiba (JP); Hidetoshi Yamabe, Chiba (JP); Kyoko Miyauchi, Chiba (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 583 days.

(21) Appl. No.: 15/128,181

(22) PCT Filed: Mar. 24, 2015

(86) PCT No.: PCT/JP2015/058958
§ 371 (c)(1),
(2) Date: Sep. 22, 2016

(87) PCT Pub. No.: WO2015/146999
PCT Pub. Date: Oct. 1, 2015

(65) Prior Publication Data
US 2017/0100802 A1  Apr. 13, 2017

(30) Foreign Application Priority Data

Mar. 25, 2014 (JP) ................. 2014-062774
May 29, 2014 (JP) ................. 2014-111493
Aug. 29, 2014 (JP) ................. 2014-175080

(51) Int. Cl.
| | | |
|---|---|---|
| B23K 35/38 | (2006.01) |
| B23K 35/02 | (2006.01) |
| B23K 35/40 | (2006.01) |
| C23C 16/26 | (2006.01) |
| C23C 16/50 | (2006.01) |
| B23K 35/26 | (2006.01) |
| B23K 35/28 | (2006.01) |
| B23K 35/30 | (2006.01) |
| B23K 35/36 | (2006.01) |

(52) U.S. Cl.
CPC .......... *B23K 35/0233* (2013.01); *B23K 35/02* (2013.01); *B23K 35/0222* (2013.01); *B23K 35/0227* (2013.01); *B23K 35/0244* (2013.01); *B23K 35/26* (2013.01); *B23K 35/262* (2013.01); *B23K 35/264* (2013.01); *B23K 35/268* (2013.01); *B23K 35/28* (2013.01); *B23K 35/282* (2013.01); *B23K 35/3013* (2013.01); *B23K 35/3612* (2013.01); *B23K 35/3613* (2013.01); *B23K 35/38* (2013.01); *B23K 35/383* (2013.01); *B23K 35/40* (2013.01); *B23K 35/404* (2013.01); *C23C 16/26* (2013.01); *C23C 16/50* (2013.01)

(58) Field of Classification Search
None
See application file for complete search history.

(56) References Cited

U.S. PATENT DOCUMENTS

| | | | |
|---|---|---|---|
| 6,416,863 B1 | 7/2002 | Schulze et al. | |
| 7,455,892 B2 * | 11/2008 | Goodwin | ................. B05B 5/00 427/569 |
| 2004/0022945 A1 | 2/2004 | Goodwin et al. | |
| 2007/0131141 A1 | 6/2007 | Masatoki et al. | |
| 2010/0127044 A1 | 5/2010 | Ota et al. | |
| 2011/0265913 A1 | 11/2011 | Liu et al. | |

FOREIGN PATENT DOCUMENTS

| | | |
|---|---|---|
| CN | 1308147 A | 8/2001 |
| EP | 0556864 A1 | 8/1993 |
| EP | 2370219 A2 | 10/2011 |
| GB | 2252559 A | 8/1992 |
| JP | H10166177 A | 6/1998 |
| JP | 2001105172 A | 4/2001 |
| JP | 2001144111 A | 5/2001 |
| JP | 2004510571 A | 4/2004 |
| JP | 2004-339583 A | 12/2004 |
| JP | 2005-254246 A | 9/2005 |
| JP | 2008-272779 A | 11/2008 |
| JP | 2009286041 A | 12/2009 |
| JP | 2010058111 A | 3/2010 |
| JP | 2010-120030 A | 6/2010 |
| JP | 2012-509991 A | 4/2012 |
| JP | 2014-195831 A | 10/2014 |
| WO | 2010059924 A2 | 5/2010 |

OTHER PUBLICATIONS

The First Office Action dated Mar. 30, 2018, from the corresponding Chinese Application No. 201580015304.8.
The extended European search report dated Aug. 28, 2017, from the corresponding European Patent Application No. EP15769736.8.
International Search Report and Written Opinion dated Jun. 23, 2015, from the corresponding PCT/JP2015/058958.

* cited by examiner

*Primary Examiner* — Adam Krupicka
(74) *Attorney, Agent, or Firm* — Katten Muchin Rosenman LLP

(57) ABSTRACT

The present invention provides a coated solder material that is capable of preventing the advancement of oxidation of the surface during long-term storage and when melted, and that has excellent wetting extendability and bondability, without the occurrence of gaps in the bonded areas. A coating film is formed on the surface of a solder material; the coating film including a carbon compound that is formed by introducing an organic compound having a carbon number of 8 or less together with a carrier gas into a reaction gas that has been plasmatized under atmospheric pressure, and after a radicalized organic compound has been formed by radicalizing the organic compound, causing the radicalized organic compound to react with the metal on the surface of the solder material; the thickness of the coating film is 4 nm to 200 nm, and when heated at 150° C. to 300° C. and melted, the mass-reduction rate is 60% or greater.

4 Claims, No Drawings

COATED SOLDER MATERIAL AND METHOD FOR PRODUCING SAME

TECHNICAL FIELD

The present invention relates to solder material that is used when manufacturing a semiconductor device, and particularly relates to coated solder material for which surface treatment is performed using a coating film, and to the method for producing that coated solder material.

BACKGROUND ART

In the manufacture of a semiconductor element bonding substrate or a semiconductor device, when connecting metal materials, or when connecting electronic parts such as semiconductor elements to a printed circuit board, typically soldering is used. The solder material that is used in soldering is formed into various shapes such as a wire, ribbon, sheet, pre-formed material (punching material), ball, fine powder and the like.

The solder material is such that oxidation occurs easily in the presence of oxygen, and an oxide film is formed on the surface during storage. Particularly, in the case where the solder material will be used after a long time has elapsed since the manufacturing of the material, oxidation proceeds and the oxidation film becomes thick, which invites bonding defects such as a decrease in the wetting extendability and bondability, or the occurrence of empty gaps (voids). In addition, the solder material is melted under high temperature during use, so the oxide film becomes even thicker. When thick oxide film that is formed in this way exists between objects that are to be bonded after bonding, problems occur in that there is bad conductivity and a decrease in bondability.

To handle these problems, conventionally, typically flux was applied beforehand to the surface of the solder material, or flux was used during bonding. As this kind of flux an inorganic acid, an organic acid, or a resin having a rosin base are known. However, an inorganic acid flux has strong activity as a flux, which may cause a decrease in the electrical properties, or cause corrosion of the bonded materials. Moreover, organic acid flux has a disadvantage in that the strength of the reaction with oxide film is weak. Furthermore, resin flux is such that flux residue is generated, and so from the aspect of electric reliability, it becomes necessary to clean and remove that residue using a solvent such as a fluorocarbon. In this way, there are problems when using any flux for uses such as a semiconductor device, which obstructs the reduction of cost.

As a way for preventing the oxidation of solder material using something other than flux, a method of forming a coating film on the surface of the solder material has been proposed. For example, JPH10166177 (A) proposes a method of coating the surface of solder material using a material that includes phosphorous and that is composed of a phosphorous compound and a surfactant, and more specifically a phosphate compound that includes a fluoroalkyl group and a nonionic surfactant. Moreover, JP2001105172 (A) and JP2001144111 (A) propose a method of coating the surface of a solder material with a nonionic surfactant, and more specifically, polyoxyethylene sorbitan aliphatic acid ester. However, all of these methods form a coating by a wet method, and it is difficult to form a thin coating film that has an even thickness everywhere of 200 nm or less. Therefore, with the coating films formed using these methods, there is large fluctuation in the film thickness, and it is not possible to sufficiently suppress oxidation of the solder material. There is also a possibility that due to the existence of this coating film, problems such as a decrease in the wetting expandability and the bondability of the solder material, and the occurrence of gaps (voids).

In regard to this, JP2010058111 (A) relates to the formation of a reflective surface of a reflector in a vehicle lamp, and discloses a dry type of surface processing that uses a reduced pressure plasma CVD method to layer an undercoat layer, a reflective layer using an evaporated silver film or the like, and a topcoat layer on a base material. In this method, a silicon oxide film (SiOx film) that is formed by plasma polymerization of a silane compound onto an undercoat layer and topcoat layer is used. With this kind of dry surface processing, it is possible that a comparatively thin coating film could be formed evenly everywhere over the entire object. Moreover, this method differs from a wet method in that the film forming material is not spread inside the factory, so it is possible to maintain a good working environment. However, in surface processing using a reduced pressure plasma CVD method, generally large and expensive vacuum equipment or pressure reducing equipment is necessary, which brings about an increase in the production cost and worsening of productivity.

On the other hand, JP2004510571 (A) and JP2009286041 (A) disclose surface processing that uses an atmospheric pressure plasma CVD method. More specifically, JP2004510571 (A) discloses a method of forming a coating (coating film) that includes polydimethylsiloxane and the like on the surface of a substrate by introducing a liquid-spray type coating forming material that includes an organic silicon compound into an atmospheric pressure plasma arc, and exposing a substrate, which is metal or the like, with the spray type coating forming material. Moreover, JP2009286041 (A) discloses technology of manufacturing a colorless gas-barrier film by performing surface processing using an atmospheric pressure plasma CVD method that uses a specific hydrocarbon such as n-pentane, n-hexane and the like on the surface of a metal oxide film that is formed on the surface of a resin film. The atmospheric pressure plasma CVD method disclosed in these documents differ from a reduced pressure plasma CVD method in that vacuum equipment or pressure reducing equipment are not necessary, so problems with increased production cost or worsening productivity do not occur.

However, in the technology disclosed in the literature above, plasmatization of a reaction gas, and activation of atomized spray type coating forming material is simultaneously performed, so activation of the spray type coating forming material becomes irregular, and it is difficult to form a minute coating film everywhere over the entire substrate surface. Moreover, the technology in the literature above is not intended for preventing oxidation of the surface of a solder material, and does not take into consideration problems such as the behavior of the coating film during melting of the solder material, the effect on the wetting extendability and bondability due to the existence of the coating film, the occurrence of gaps and the like.

RELATED LITERATURE

Patent Literature

[Patent Literature 1] JPH10166177 (A)
[Patent Literature 2] JP2001105172 (A)
[Patent Literature 3] JP2001144111 (A)
[Patent Literature 4] JP2010058111 (A)

[Patent Literature 5] JP2004510571 (A)
[Patent Literature 6] JP2009286041 (A)

SUMMARY OF INVENTION

Problems to be Solved by Invention

An object of the present invention is to provide a coated solder material that can prevent the advancement of oxidation of the surface during long-term storage and during melting, has excellent wetting extendability and bondability, and does not have gaps in the bonding area. Moreover, an object of the present invention is to provide a method for manufacturing this kind of coated solder material efficiently in a short amount of time.

Means for Solving Problems

The coated solder material of the present invention is a coated solder material with a coating film formed on the surface of the solder material; in which the coating film includes a carbon compound that is formed by introducing an organic compound having a carbon number of 8 or less together with a carrier gas into a reaction gas that has been plasmatized under atmospheric pressure, and then after a radicalized organic compound has been formed by radicalizing the organic compound, causing the radicalized organic compound to react with the metal on the surface of the solder material; and the thickness of the coating film is 4 nm to 200 nm, and when heated at 150° C. to 300° C. and melted, the mass-reduction rate is 60% or greater.

Preferably, the difference between the maximum value and the minimum value of the thickness of the coating film is 10 nm or less.

Preferably, the outer diameter of the solder material that is processed into a wire shape is taken to be r, and when that solder material is made to stand up on a Cu substrate that has been heated for 25 seconds at a temperature that is 50° C. higher than the melting point of the solder material, then further heated for another 25 seconds and cooled to room temperature, the outer diameter of the solder material that was bonded to the Cu substrate is taken to be d, and when the ratio of d with respect to r is defined as the wetting extendability X, the ratio of the wetting extendability $X_m$ of the coated solder material that was formed by coating the solder material with the coating film with respect to the wetting extendability $X_R$ of the uncoated solder material is within the range 1.05 to 1.60.

Preferably, the solder material is one kind selected from among the group of Bi solder material, Bi—Sn solder material, Pb solder material, Sn solder material, Au solder material, In solder material, or Zn—Sn solder material.

The method for producing a coated solder material of the present invention includes:

a radicalization step of forming a radicalized organic compound by introducing an organic compound having a carbon number of 8 or less together with a carrier gas into a reaction gas that has been plasmatized under atmospheric pressure, and radicalizing that organic compound; and a coating process of forming a coating film that includes a carbon compound having a thickness of 4 nm to 200 nm on the surface of a solder material by causing the radicalized organic compound to react with the metal on the surface of the solder material.

Preferably, a hydrocarbon gas that includes an aliphatic compound and/or alicyclic compound having a carbon number of 4 or less is used as the organic compound. Alternatively, a hydrocarbon solvent that includes at least one kind selected from among the group of an aliphatic compound, alicyclic compound and an aromatic compound having a carbon number of no less than 5 and no greater than 8 is preferably used as the organic compound.

Preferably, at least one selected from among the group of argon, helium, nitrogen, oxygen and air is used as the reaction gas.

Preferably, at least one selected from among the group of argon, helium and nitrogen is used as the carrier gas.

Moreover, preferably the coating film is formed using an atmospheric pressure plasma polymerization device, in which the nozzle distance is 5 mm to 30 mm, and the nozzle speed or the conveyance speed of the substrate is 1 m/min to 40 m/min.

Effect of Invention

With the present invention, it is possible to provide a coated solder material that is capable of preventing the advancement of oxidation of the surface during long-term storage and when melted, and that has excellent wetting extendability and bondability, without the occurrence of gaps in the bonded areas. Moreover, with the present invention, it is possible to provide a method for efficiently producing this kind of coated solder material in a short time. Therefore, the industrial significance of the present invention is very large.

MODES FOR CARRYING OUT INVENTION

The inventors diligently researched coated solder materials that can prevent the advancement of oxidation of the solder material surface during long-term storage and when melted, have excellent wetting extendability and bondability, and do not have gaps in the bonding area. As a result, it was learned that by using as a coating film a material that is made using a carbon compound, and that has suitable thermal decomposition, it is possible to achieve bonding without gaps while suppressing oxidation of the solder material during storage and when melted and greatly reducing effects on the wetting extendability and bondability. Moreover, it was learned that by performing atmospheric pressure plasma polymerization under specified conditions of an organic compound having a carbon number of 8 or less, it is possible to form this kind of coating film can be formed easily and evenly everywhere over the entire surface of the solder material even in production on an industrial scale. The present invention was achieved based on this knowledge.

1. Coated Solder Material

The coated solder material of the present invention is a coated solder material of which a coating film is formed over the solder material surface. This coating film is made using a carbon compound that is formed by introducing an organic compound having a carbon number of 8 or less together with a carrier gas into a reaction gas that has undergone plasmatization under atmospheric pressure, and forming a radicalized organic compound by radicalizing this organic compound, after which the radicalized organic compound is made to react with the metal on the surface of the solder material; and this coating film has a thickness of 4 nm to 200 nm, and has a mass-reduction rate of 60% or more when heated to 150° C. to 300° C. and melted. The solder material to which the present invention is applied is interpreted as including not only solder, but also a brazing filler metal.

(1) Coating Film

The coating film in the present invention uses an organic compound having a carbon number of 8 or less as the coating material, and can be formed on the solder material by performing only an atmospheric pressure plasma polymerization process under specified conditions. In other words, it is necessary to form the coating film by the coating film formation method of the present invention.

Even though this coating film is a thin film, the coating film is extremely strong and highly safe, and is evenly formed everywhere over the entire surface of the solder material. Therefore, the advancement of oxidation of the solder material surface is suppressed, and it is possible to suppress a decrease in the wetting extendability and bondability and effectively prevent the occurrence of gaps (voids) in the bonding areas.

a) Thickness

For the coated solder material of the present invention, it is necessary to control the thickness of the coating film to be within the range of 4 nm to 200 nm. When the thickness of the coating film is less than 4 nm, it is not possible to sufficiently suppress the advancement of oxidation of the solder material surface, which brings about a decrease in the wetting extendability and bondability, and invites the generation of gaps (voids). On the other hand, when the thickness of the coating film is greater than 200 nm, it is possible to suppress the advancement of oxidation of the solder material surface, however, the effect of this coating film brings about a decrease in the wetting extendability and bondability, and similarly invites the generation of gaps. In order to achieve better wetting extendability and bondability, the minimum value of the thickness of the coating film is preferably 6 nm or greater, and more preferably 8 nm or greater, and even more preferably 10 nm or greater. Moreover, the maximum value of the coating film is preferably 100 nm or less, and more preferably 50 nm or less, and even more preferably 25 nm or less.

The coating film of the present invention has excellent uniformity of thickness. More specifically, when the thickness of the coating film is within the range above, the difference between the maximum value and the minimum value is within 10 nm, and preferably is within 7 nm, and more preferably is within 5 nm. Therefore, the coated solder material of the present invention can be evaluated as having very little variation in each of the characteristics that will be described later.

The thickness of the coating film and the minimum value and maximum value thereof can be found by observation using a transmission electron microscope (TEM) or the like with the coated solder material in a state in which cross-sectional observation is possible. More specifically, the thickness of the coating film and the minimum value and maximum value thereof can be found by measuring the thickness of the coating film at three or more arbitrary positions in the cross section of the coated solder material, and calculating the average value, the maximum value and the minimum value.

b) Thermal Decomposition

The coating film of the coated solder material of the present invention is such that when heated to 150° C. to 300° C. and melted, the mass-reduction rate $\alpha$ is 60% by mass or greater, and preferably 70% by mass or greater, and more preferably 80% by mass or greater. Here, the mass-reduction rate $\alpha$ of the coating film is a value that is found from Equation (A) below where $w_1$ is taken to be the mass of the coating film before heating, and $w_2$ is taken to be the mass of the coating film after heating to the temperature above.

$$\alpha = (w_1 - w_2)/w_1 \times 100 \quad (A)$$

In other words, the coating film of the coated solder material of the present invention is characterized by having a high thermal decomposition property, and when performing soldering, half or more thermally decomposes. Therefore, as long as the thickness of the coating material is within the range described above, the residual amount of coating film after melting is very little, and there is hardly any effect on the wetting extendability or bondability of the solder material. On the other hand, when the mass-reduction rate is less than 60% by mass, the wetting extendability or bondability of the solder material decreases due to the coating film that remains after melting.

In the evaluation of the thermal decomposition properties described above, the amount of time that the coated solder material is heated differs according to the composition of the solder material, however, normally about 30 minutes is sufficient.

c) External Appearance

The coating film of the coated solder material of the present invention is very strong and highly safe, and there is very little degradation over time. Moreover, the coating film is colorless and transparent, is very thin and is evenly formed everywhere over the entire surface of the solder material. Therefore, it is possible to greatly reduce the occurrence of a poor appearance such as processing irregularities, stains or the like when forming the coating film.

(2) Solder Material

The coating film of the coated solder material of the present invention can be applied regardless of the shape of the solder material, for example can be applied to solder material having various shapes such as a wire, a ribbon, a sheet, a pre-formed material (punched material), a ball, fine powder and the like.

Moreover, the composition of the solder material is also not limited, and for example, it is possible to apply the invention to various kinds of solder material such as Bi (bismuth) solder material, Bi—Sn (bismuth-tin) solder material, Pb (lead) solder material, Sn solder material, Au (gold) solder material, In (indium) solder material, Zn—Sn (zinc-tin) solder material and the like. The composition of the solder material can be found using an ICP atomic emission spectrophotometry method.

a) Bi Solder Material

Bi solder material is a solder material that includes one or more kind of a second element that is selected from the group of Zn and Ag (silver). In this solder material, the amount of Bi included is preferably 28% by mass, and more preferably no less than 85% by mass and no greater than 99% by mass. Moreover, when Zn is included, the amount of Zn included is preferably no less than 0.01% by mass and no greater than 13.5% by mass, and more preferably no less than 0.2% by mass and no greater than 5.0% by mass. On the other hand, when Ag is included, the amount of Ag included is preferably no less than 0.01% by mass and no greater than 12.0% by mass, and more preferably no less than 0.5% by mass and no greater than 5.0% by mass.

Depending on the use and purpose of the solder material, it is also possible to include a third element other than Bi, Zn and Ag. As this third element, it is possible to use one or more element selected from among the group Sn, Cu (copper), Au, In, Ni (nickel), Sb (antimony), Ge (germanium), Si (silicon), Te (tellurium), and P (phosphorous). The total amount of the third elements included is preferably 5.0% mass or less.

b) Bi—Sn Solder Material

Bi—Sn solder material is a solder material that includes Bi and Sn. In this solder material, the amount of Bi included is no less than 40% by mass and no greater than 85% by mass, and preferably is no less than 45% by mass and no greater than 60% by mass. On the other hand, the amount of Sn included is no less than 15% by mass and no greater than 60% by mass, and preferably is no less than 40% by mass and no greater than 60% by mass.

In Bi—Sn solder material as well, depending on the use and purpose of the solder material, it is also possible to include a third element other than Bi and Sn. As this third element, it is possible to use one or more element selected from among the group Cu, Ag, In, Ni, Sb, Ge, Si, Te, and P. The total amount of the third elements included is preferably 5.0% by mass or less, and more preferably is 4.5% by mass or less.

c) Pb Solder Material

Pb solder material is a solder material that includes Pb as the main component, and one or more kind of a second element that is selected from among the group of Sn, Ag, Cu, In, Te and P. In this solder material, the total amount of Pb and the second element included is 95% by mass or greater, and preferably the total is 97% by mass or greater.

The amount of Pb included is preferably no less than 80% by mass and no greater than 98% by mass, and more preferably is no less than 85% by mass and no greater than 98% by mass. Moreover, the amount of the second element included is preferably no less than 2% by mass and no greater than 15% by mass, and more preferably is no less than 2% by mass and no greater than 12% by mass.

In Pb solder material as well, depending on the use and purpose of the solder material, it is also possible to include a third element other than Pb and the second element. As this third element, it is possible to use one or more element selected from among the group Ni, Ge, Co (cobalt), Sb and Bi. The total amount of the third elements included is preferably 5.0% by mass or less, and more preferably is 4.5% by mass or less.

d) Sn Solder Material

Sn solder material is a solder material that includes Sn as the main component, and one or more kind of a second element that is selected from among the group of Ag, Sb, Cu, Ni, Ge and P. This solder material is used as a "lead-free" solder. In this solder material, the total amount of Sn and the second element included is 95% by mass or greater, and preferably is 97% by mass or greater.

The amount of Sn included is preferably no less than 80% by mass and no greater than 98% by mass, and more preferably is no less than 90% by mass and no greater than 98% by mass. Moreover, the amount of the second element included is preferably no less than 1% by mass and no greater than 10% by mass, and more preferably is no less than 2% by mass and no greater than 7% by mass.

In Sn solder material as well, depending on the use and purpose of the solder material, it is also possible to include a third element other than Sn and the second element. As this third element, it is possible to use one or more element selected from among the group In, Co, or Bi. The total amount of the third elements included is preferably 5% by mass or less, and more preferably is 3% by mass or less.

e) Au Solder Material

Au solder material is a solder material that includes Au as the main component, and one or more kind of a second element that is selected from among the group of Ge, Sn and Si. In this solder material, the total amount of Au and the second element included is 90% by mass or greater, and preferably is 98% by mass or greater.

The amount of Au included is preferably no less than 75% by mass and no greater than 98% by mass, and more preferably is no less than 79% by mass and no greater than 97.5% by mass. The amount of the second element included is preferably no less than 2% by mass and no greater than 25% by mass, and more preferably is no less than 2.5% by mass and no greater than 21% by mass.

In Au solder material as well, depending on the use and purpose of the solder material, it is also possible to include a third element other than Au and the second element. As this third element, it is possible to use one or more element selected from among the group Ag, Sb, In, Al (aluminum), Cu, Ni and P. The total amount of the third elements included is preferably 10% by mass or less, and more preferably is 8% by mass or less.

f) In Solder Material

In solder material is a solder material that includes In as the main component, and one or more kind of a second element that is selected from among the group of Ag, Sn, Cu, Zn and P. In this solder material, the amount of In included is preferably no less than 40% by mass and no greater than 99.9% by mass, and more preferably is no less than 45% by mass and no greater than 60% by mass. Moreover, the amount of the second element included is preferably no less than 0.1% by mass and no greater than 60% by mass, and more preferably is no less than 0.5% by mass and no greater than 55% by mass.

g) Zn—Sn Solder Material

Zn—Sn solder material is a solder material that includes Zn and Sn as the main components, and that does not include Al. Not including Al means that Al is not included at all, or in the case that Al is included, the amount included is 0.10% by mass or less. In this solder material, the total amount of Zn and Sn included is 80% by mass or greater, and preferably 90% by mass or greater.

The amount of Zn included is preferably no less than 70% by mass and no greater than 90% by mass, and more preferably is no less than 75% by mass and no greater than 88% by mass. The amount of Sn included is preferably no less than 5% by mass and no greater than 30% by mass, and more preferably is no less than 7% by mass and no greater than 20% by mass.

Moreover, in Zn—Sn solder material as well, depending on the use and purpose of the solder material, it is also possible to include a third element other than Zn and Sn and the second element. As this third element, it is possible to use one or more element selected from among the group Ag, Cu, Ge, Ni, Sb and P. The amount of the third elements included is preferably 20.0% by mass or less, and more preferably is 15% by mass or less.

(3) Characteristics of Coated Solder Material

The coated solder material of the present invention includes a coating film as described above, so it is possible to prevent the advancement of oxidation of the surface during long-term storage and when melted. Moreover, the wetting extendability and bondability are excellent, and it is possible to prevent the occurrence of gaps in the bonded areas. Furthermore, durability (heat resistance) is also excellent, and the material can be evaluated as being highly reliable.

a) Oxidation Resistance

The coated solder material of the present invention has excellent resistance to oxidation, and the state of the surface hardly changes during long-term storage or when melted. For example, when the coated solder material of the present invention underwent a neutral salt spray test (complying to JIS2371), there was no discoloring or worsening of the surface of the material when compared with the initial state.

The state of the surface of the coated solder material can be checked by observation using an optical microscope.

b) Wetting Extendability

With the present invention, when the wetting extendability of uncoated solder material is taken to be $X_R$, and the wetting extendability of the coated solder material that was formed by forming a coating film on the solder material is taken to be $X_m$, the ratio of $X_m$ with respect to $X_R$ ($X_m/X_R$) can preferably be taken to be 1.05 to 1.60, and more preferably 1.20 to 1.45. In other words, with the present invention, by forming a coating film as described above on the solder material, it can be said to be possible to improve the wetting extendability of the material. It is considered that the reason for this is that when the coated solder material is melted, half or more of the coating film undergoes thermal decomposition, so in addition to hardly any of the coating film remaining on the surface of the joined solder material, the decomposition product of the coating film reduces the oxide on the solder material surface.

In regard to this, when the ratio $X_m/X_R$ is less than 1.05, the wetting extendability is low and there is a possibility that gaps will occur in the bonded areas. On the other hand, when the ratio $X_m/X_R$ is greater than 1.60, the thermal stress relaxation characteristic of the bonded areas decreases when semiconductor elements and the like are bonded to a substrate using this coated solder material, so it becomes easy for cracking to occur in the bonded areas.

Here, the wetting extendability X ($X_m$ and $X_R$) of the solder material can be found as described below. First, after measuring the outer diameter r of solder material that has been processed into a wire shape, that solder material is cut into test pieces having a length of about 3 cm to 5 cm. Next, a test piece was heated for 25 seconds at a temperature 50° higher than the melting point of the solder material and made to stand up on a Cu substrate, and further heated for 25 seconds, after which the test piece was cooled to room temperature and at that point the outer diameter d of the test piece that was bonded to the Cu substrate was measured. Finally, it is possible to calculate the wetting extendability X by calculating the ratio of d with respect to r (d/r).

Measurement of r and d described above is not particularly limited, and can be measured using known methods. For example, the outer diameter can be measured using a microscope at an arbitrary position of the solder material that has been processed to a wire shape, after which the diameter in a direction orthogonal to this can be measured and the outer diameter r can be found by calculating the average value of these measurements. Moreover, similarly, the outer diameter d of the solder material (test piece) that was bonded to the Cu substrate can be found.

c) Durability

The coated solder material of the present invention has excellent durability (heat resistance) and can be evaluated as being highly stable. For example, as in the case of evaluating the wetting extendability, when a Cu substrate to which solder is bonded undergoes 500 cycles of a heat-cycle test in which 1 cycle includes cooling to −55° C. and heating to +155° C., hardly any defects occur on the bonding surface. The state of the bonding surface can be checked by embedding the Cu substrate into resin or the like and cutting and polishing the cross section at an arbitrary position, and observing that cross section using a scanning electron microscope (SEM).

2. Method For Producing Coated Solder Material

The method for producing the coated solder material of the present invention includes:

(1) a radicalization process in which an organic compound having a carbon number of 8 or less is introduced together with a carrier gas into a reaction gas that was plasmatized under atmospheric pressure, and a radicalized organic compound is formed by radicalizing this organic compound; and (2) a coating process in which a coating film having a thickness of 4 nm to 200 nm and that includes a carbon compound is formed on the surface of a solder material by causing the radicalized organic compound to react with the metal on the surface of the solder material.

(1) Radicalization Process

The radicalization process is a process in which an organic compound having a carbon number of 8 or less is introduced together with a carrier gas into a reaction gas that has been plasmatized under atmospheric pressure, and a radicalized organic compound is formed by radicalizing that organic compound. The state of this radicalized organic compound is not particularly limited as long as the organic compound can react with the metal on the surface of the solder material in the coating process that will be described next, and can be a monomer, a half polymer or a polymer.

a) Atmospheric Pressure Plasma Polymerization

In the present invention, it is necessary to form a coating film that includes a carbon compound on the surface of a solder material by atmospheric pressure plasma polymerization that will be explained below. Plasma polymerization is conventional technology that has been widely known, however, atmospheric pressure plasma polymerization that is used in the present invention causes a chemical reaction that does not normally proceed to proceed by activation of reaction particles using atmospheric pressure plasma. This kind of atmospheric pressure plasma polymerization is suitable to continuous processing, so is highly productive, and since vacuum equipment is not necessary, the processing cost is low and only simple equipment is necessary.

As the atmospheric pressure plasma, corona discharge, dielectric barrier discharge, RF discharge, microwave discharge, arc discharge and the like can be used, however, in the present invention the atmospheric pressure plasma is not particularly limited, and any atmospheric pressure plasma can be applied. Therefore, as long as the reaction gas can be plasmatized under atmospheric pressure, the device to be used for generating plasma is not particularly limited, and it is possible to use a known plasma generating device. In the present invention, atmospheric pressure includes atmospheric pressure (1013.25 hPa) and air pressure near atmospheric pressure, and air pressure within the normal range of change in atmospheric pressure is also included.

However, it is necessary to introduce by way of a carrier gas an organic compound having a carbon number of 8 or less into a reaction gas that was plasmatized in advance. By using this kind of configuration, it is possible to instantly radicalize the organic compound, so it becomes possible to form a minute coating film everywhere over the entire surface of the solder material while maintaining the basic structure (carbon structure) of the organic compound.

In regard to this, in a formation method for a coating film that uses a conventional atmospheric plasma CVD method, the reaction gas, carrier gas and coating material are supplied to the device, after which plasmatization of the reaction gas and activation (radicalization) of the coating material are performed simultaneously, and it is not possible to uniformly perform activation of the coating material. Therefore, in a conventional method for producing coated solder material, it was not possible to form a minute coating film, or it was difficult to evenly form a coating film everywhere over the entire surface of the solder material.

b) Plasmatization Conditions

The conditions for plasmatizing the reaction gas should be appropriately selected according to the plasma device used, the purpose and the thickness of the coating film, however, from the aspect of efficiently radicalizing an organic compound having a carbon number of 8 or less and forming a minute coating film, preferably the generator output voltage is 150V to 350V, and more preferably 200V to 330V. When the generator output voltage is less than 150V, it may not be possible to sufficiently plasmatize the reaction gas and sufficiently radicalize the organic compound. On the other hand, when the generator output is greater than 350V, there may be a problem in that the device could be damaged.

c) Reaction Gas

The reaction gas is not particularly limited as long as the reaction gas can be easily plasmatized, and for example, it is possible to use Ar (argon), He (helium), Ne (neon), Kr (krypton), Xe (xenon), $N_2$ (nitrogen), $O_2$ (oxygen) and air. These reaction gases can be used alone, or it is also possible to use two or more kinds that have been mixed at a specified ratio. Of these gases as well, from the aspect of cost and ease of procurement, preferably at least one gas is selected from among the group of Ar, He, $N_2$, $O_2$ and air. Using inexpensive $N_2$, $O_2$ or air is particularly preferred, and using air is even more preferred.

d) Carrier Gas

As long as the carrier gas is able to smoothly carry an organic compound, the carrier gas is not particularly limited for example, it is possible to use Ar, He, Ne, Kr, Xe and $N_2$. These gases can be used alone, or it is also possible to use two or more gases that have been mixed at a specified ratio. Of these gases as well, similarly, from the aspect of cost and ease of procurement, preferably at least one gas is selected from among the group of Ar, He and $N_2$, and using $N_2$ is even more preferred.

e) Organic Compound

For the organic compound, it is necessary that when the coating film is formed, and when the organic compound be heated to 150° C. to 300° C. and be melted, the mass-reduction rate be 60% by mass or more. As an organic compound for forming this kind of coating film, it is necessary that the organic compound have a carbon number of 8 or less. This is because in the case of an organic compound having a carbon number that is 9 or greater, in the normal state the compound is a liquid, and the comparative volatility is low, so uniformly mixing the organic compound with a carrier gas is difficult, and evenly forming a minute coating film having a thickness of 4 nm to 200 nm everywhere over the surface of a solder material is difficult.

As an organic compound having a carbon number of 8 or less, it is possible to suitably use a hydrocarbon gas having a carbon number of 4 or less, or a hydrocarbon solvent having a carbon number that is no less than 5 and no greater than 8. Hydrocarbon compounds that in the normal state are a gas and that have a carbon number of 4 or less, and compounds of which part of the hydrogen atoms of the hydrocarbon compound are replaced with other atoms or functional group are included as a hydrocarbon gas. Moreover, hydrocarbon compounds that in the normal state are a liquid and have a carbon number of no less than 5 and no greater than 8, and compounds of which part of the hydrogen atoms of the hydrocarbon compound are replaced with other atoms or functional group are included as a hydrocarbon solvent. These organic compounds in the normal state are a gas, or are a liquid having suitable volatility, so uniform mixing with a carrier gas is easy, and even in production on an industrial scale, it is possible to easily and evenly form a minute coating film everywhere over the surface of the solder material.

In the present invention, it is presumed that one of either a hydrocarbon gas or a hydrocarbon solvent is used as the organic compound, however, as long as it is possible to maintain the ease of handling and safety, it is also possible to use a mixture of a hydrocarbon gas and hydrocarbon solvent. Moreover, when introducing the organic compound (hydrocarbon gas, hydrocarbon solvent), it is not absolutely necessary that only an organic compound be introduced, and as long as the main component is an organic compound, it is also possible to introduce an organic compound that is mixed with a stabilizing agent or oxidation inhibitor.

It is necessary to appropriately adjust the amount of organic compound introduced by taking into consideration the type of organic compound used, the shape and size of the solder material to be coated, the plasmatization conditions and the like, so that the thickness of the coating film is within the range described above.

[Hydrocarbon Gas]

The hydrocarbon gas is gaseous in the normal state, is capable of easily and uniformly mixing with a carrier gas or reaction gas, and is capable of maintaining the mixed state over a comparatively long time. Therefore, uniform radicalization (activation) in the radicalization process is easy, and it is possible to evenly form a very minute coating film everywhere over the entire surface of the solder material.

As this kind of hydrocarbon gas, preferably an aliphatic compound and/or an alicyclic compound having a carbon number of 4 or less is used.

For example, as an aliphatic compound having a carbon number that is 4 or less, it is possible to use alkane, alkene and alkyne. More specifically, it is possible to use at least one kind selected from among methane, ethane, ethylene, acetylene, propane, propylene, n-butane, isobutane, n-pentane, isopentane, neopentane, methylacetylene, ethyl acetylene, 1-butene, cis-2-butene, trans-2-butene, isobutene and 1,3-butadiene.

Moreover, as an alicyclic compound, it is possible to use at least one selected from among cyclopropane, cyclobutane, and cyclobutene.

However, these hydrocarbon gases are harmful to humans, so when handling them (particularly when mixed with a carrier gas), it is necessary to prevent scattering and to maintain safety by installing local exhaust ventilation.

[Hydrocarbon Solvent]

The hydrocarbon solvent is normally in a liquid state and has suitable volatility, so not only has excellent safety, but uniform mixing with a carrier gas or reaction gas is possible. Therefore, similar to a hydrocarbon gas described above, uniform radicalization (activation) in the radicalization process can be performed comparatively easily, and it is possible to evenly form a minute coating film everywhere over the entire surface of the solder material.

As this kind of hydrocarbon compound, it is possible to use an aliphatic compound, an alicyclic compound or an aromatic compound having a carbon number of no less than 5 and no greater than 8.

For example, as a aliphatic compound having a carbon number that is no less than 5 and no greater than 8, in addition to alkane, alkene and alkyne, it is possible to use alcohol, carboxylic acid and the like. Among of them, when the ease of thermal decomposition of the coating film are taken into consideration, alkane is preferred. More specifically, in addition to a compound having a straight chain such as n-pentane, n-hexane, n-butane, n-octane and the like, it is possible to suitably use a branched compound such as 2-methylbutane, 2,2-dimethylpropane, 2-methylpentane, 3-methylpentane, 2,2-dimethylbutane, 2,3-dimethylbutane, 2-methyhexane, 3-methylhexane, 2-ethylpentane, 3-ethylpentane, 2,2-dimethylpentane, 2, 3-dimethylpentane, 2,4-dimenthylpentane, 3,3-dimethylpentane, 2-methylbutane, 2,3-dimethylhexane, 3-ethylhexane or the like.

As an alicyclic compound having a carbon number no less than 5 and no greater than 8, it is possible to use cyclopentane, cyclohexane, cycloheptane, cyclooctane, methyl cyclopentane, cyclopentanol, cyclohexanol, cycloheptanol, cyclooctanol, methyl cyclopentane, ethyl cyclopentane, cis-1,3-dimethyl cyclopentane, methyl cyclohexane, norbornane, cyclohexene or the like.

As an aromatic compound having a carbon number no less than 5 and no greater than 8, it is possible to use benzene, toluene, xylene, ethyl benzene or the like.

Among of them, when the ease of handling and the thermal decomposition of the coating film are taken into consideration, a straight-chain n-pentane, n-hexane and n-heptane are preferred, and n-hexane is particularly preferred.

However, there are cases depending on conditions when mixing with a carrier gas or when performing radicalization in which the volatile state of the hydrocarbon solvent cannot be maintained for a long time. In that case, the hydrocarbon solvent becomes liquid, and there is a possibility that deviation will occur in the distribution and that variation in the composition and thickness of the coating film will occur. Therefore, it is necessary to properly control the conditions when mixing with a carrier gas or when performing radicalization.

(2) Coating Process

The coating process is a process in which a coating film that includes a carbon compound having a thickness of 4 nm to 200 nm is formed on the surface of the solder material by causing a radicalized organic compound to react with the metal of the surface of the solder material.

a) Solder Material

In the present invention, the solder material to be coated is not particularly limited, for example, it is possible to apply the invention to solder material having various shapes such as a wire, ribbon, sheet, pre-formed material, ball, fine powder and the like. However, no matter what the solder material is, the effect of the invention can certainly be obtained by controlling conditions such as the temperature and atmosphere during formation, adjusting the oxide film that is formed on the surface to be thin, and reducing the surface roughness.

Hereafter, the method for forming the solder material of the present invention will be explained in detail by giving examples of forming sheet-shaped solder material and wire-shaped solder material. However, an explanation of parts that are similar to a conventional formation method will be omitted or simplified.

a-1) Melting of Raw Material

As the method for melting the raw material, it is possible to use a known method such as a resistive heating method, reduction diffusion method, high-frequency induction heating method and the like, and particularly, a high-frequency induction heating method that is capable of efficient melting in a short period of time is preferred. The raw material that is melted by these methods is formed into a mother alloy ingot of solder having a desired shape by casting in a mold that was prepared in advance.

When oxygen exists during melting and casting, not only does oxidation of the raw material proceed, by an oxide film is mixed in during casting, and thus the oxide film on the surface of the obtained solder material becomes thick or the surface roughness becomes rough. Therefore, preferably the atmosphere during melting of the raw material is made to be an inert gas atmosphere, and during casting inert gas flows into the molten metal opening of the mold.

a-2) Molding the Solder Material

[Sheet-Shaped Solder Material]

When molding sheet-shaped solder material, it is necessary to roll out the solder mother allot ingot. The rolling method is not particularly limited and depending on the characteristics of the solder material can be appropriately selected from among cold rolling, warm rolling, hot rolling and press rolling. Moreover, it is also possible to combine two or more of these methods. As a result, not only is it possible to suppress the occurrence of cracking and burrs during rolling, it is also possible to increase the speed of rolling and improve productivity. For example, Au solder material is harder than Pb or Sn solder material, so after being rolled out thin to a certain thickness by warm rolling or hot rolling, it is preferred that cold rolling be performed.

From the aspect that it becomes easy for oxidation of the solder material surface to proceed and the oxide film becomes thin, warm rolling or hot rolling cannot be said to be suitable methods. Therefore, when performing rolling using these methods, the conditions during rolling must be strictly managed taking into consideration productivity, the thickness of the aimed oxide film.

The surface roughness (arithmetic mean roughness Ra) of the roll used in rolling is preferably 0.30 μm or less, and more preferably 0.20 μm. However, when two or more rolling methods are combined, at least the surface roughness (Ra) of the roll that is used in the final rolling should be 0.30 μm or less. When the surface roughness (Ra) of the rolling roll is greater than 0.30 μm, it becomes difficult to reduce the surface roughness of the solder material that is obtained. Therefore, even when the thickness of the oxide film is kept very thin, for example 120 μm or less, the wetting extendability and bondability of the solder material may become bad. The surface roughness (Ra) means the arithmetic mean roughness of a roughness curve, and for example, can be found by measurement using an atomic force microscope.

[Wire-Shaped Solder Material]

When molding wire-shaped solder, the solder mother alloy ingot is molded by an extrusion method or wire drawing method.

For example, when molding using the extrusion method, it is necessary to select a proper extrusion temperature according to the composition of the solder material. This is because when the extrusion temperature is too high, it becomes easy for oxidation of the surface to proceed, and on the other hand, when the extrusion temperature is too low, the solder material is extruded in a hard state, so molding takes a long time.

Moreover, extrusion is preferably performed in an inert gas, and more preferably is performed in a sealed state in which the inert gas is allowed to circulate. This is because when oxygen is present during extrusion, wire that is heated to the extrusion temperature oxidizes right away.

a-3) Polishing and Cleaning

In order to make the oxide film on the solder material surface thin, and reduce the surface roughness (Ra), preferably the solder material surface undergoes acid cleaning and polishing. The timing for performing acid cleaning and polishing can be after molding of the solder mother alloy, before specified processing, during processing, or after processing.

The type of acid used when performing acid cleaning is not particularly limited as long as the acid is appropriately selected according to the composition of the solder material, and it is possible to use either an inorganic acid or organic acid. However, taking cost into consideration, preferably an inorganic acid that is inexpensive that is very effective in removing an oxide film is preferred. More specifically, as an inorganic acid, it is possible to use hydrochloric acid, sulfuric acid, nitric acid, phosphoric acid, acetic acid and the like. Moreover, as an organic acid, it is possible to use citric acid, oxalic acid and the like. However, using a strong acid causes the rate of dissolution of the solder material into an acid solution to become fast, and there is a possibility that partial dissolution will occur, the surface roughness (Ra) will increase, and changes in the composition will occur. Therefore, preferably a weak acid having a slow rate of dissolution and that is easy to handle will be used. Therefore, in acid cleaning, it is necessary to sufficiently take into consideration the acid concentration, the cleaning time and the cleaning temperature.

For example, when Pb solder material is cleaned using a 5% acetic acid solution, preferably the cleaning temperature is 20° C. and the cleaning time is 15 minutes. In this case, the dissolved amount is the greatest immediately after the oxide film on the surface of the solder material comes in contact with the acetic acid solution, then after that, gradually decreases and at a certain stage becomes saturated. More specifically, when cleaning an oxide film that is 100 µm thick, the thickness of the oxide film becomes 20 µm to 30 µm in about 5 minutes, and becomes about 10 µm after about 15 minutes.

On the other hand, when polishing the solder material surface, the polishing method is not particularly limited. For example, polishing can be performed by placing the solder material between abrasive paper, applying an appropriate amount of pressure and then winding up the material while pulling. Alternatively, polishing can be performed by moving abrasive paper back-and-forth in the polishing direction (winding direction) and perpendicular direction of the solder material.

b) Reaction Between Radicalized Organic Compound and Solder Material Surface

As was described above, radicalized organic compounds exist in various states such as monomers, half polymers, and polymers. Therefore, as the reaction between the radicalized organic compound and the solder material surface there is:

(i) the form in which the radicalized organic compound is polymerized after reacting with the metal of the solder material surface;

(ii) the form in which the radicalized organic compound reacts with the metal of the solder material surface while being polymerized; and (iii) the form in which the radicalized organic compound reacts with the metal of the surface of the solder material after being polymerized.

In the production method for production coated solder material of the present invention, as long as it is possible to obtain the coated solder material described above, the form of the reaction is not limited.

c) Nozzle Distance and Nozzle Moving Speed

In the present invention, as described above, it is necessary that the thickness of the coating film be in the range 4 nm to 200 nm. This thickness can be appropriately adjusted by the condition settings of the plasma polymerization device that is used.

For example, when an atmospheric pressure plasma polymerization device (Plasma Polymer Laboratory Systems, Model PAD-1) is used as the plasma polymerization device, the nozzle distance is preferably 5 mm to 30 mm, and more preferably 7 mm to 25 mm, and the nozzle moving speed is preferably 1 m/min to 40 m/min, and more preferably 7 m/min to 35 m/min. By adjusting the nozzle distance and the nozzle speed to be within such ranges, it is possible to efficiently form a coating film having a suitable thickness and with little variation in the thickness, while at the same time suppressing oxidation of the solder material surface.

However, depending on the combination of organic compound and solder material, there are cases in which the thickness of the coating film is not within the range 4 nm to 200 nm even though the nozzle distance and nozzle moving speed is set to be within the ranges described above. Therefore, appropriately selecting the nozzle distance and the nozzle speed by performing preliminary testing is particularly preferred.

In the present invention, the nozzle distance is the distance from the tip end of the nozzle that sprays organic compound, which is the material of the coating film, to the surface of the solder material on which the coating film is formed. Moreover, the nozzle moving speed is the speed at which the nozzle moves with respect to the solder material, and the conveying speed of the base material is the speed at which the solder material moves with respect to the nozzle.

d) Number of Times Atmospheric Pressure Plasma Polymerization is Performed

In the coating process, by appropriately controlling conditions such as the nozzle distance and nozzle moving speed, it is possible to form a coating film having a suitable thickness even when atmospheric pressure plasma polymerization is performed on the solder material only one time. However, it is certainly possible to form a more minute coating film on the solder material surface by performing atmospheric pressure plasma polymerization multiple times. However, in that case, there is a possibility that not only will productivity of production of the coated solder material decrease, it will also become difficult to form a thin coating film. Therefore, the number of times that atmospheric pressure plasma polymerization is performed must be appropriately set taking into consideration the characteristics desired for the coated solder material.

3. Die Bonding Method Using Coated Solder Material

The coated solder material of the present invention can be used for bonding various semiconductor elements to a substrate. More specifically, the coated solder material can be used to bond various kinds of semiconductor devices such as a discretes, IC (integrated circuit) chips, modules and the like to a substrate. Hereafter, the die bonding method that uses the coated solder material of the present invention will be explained using an example of bonding an IC chip to the die portion of a lead frame.

When performing the bonding using the coated solder material of the present invention, in order to keep the IC chips level, preferably particles having a high melting point are added to the solder material. As the particles having a high melting point, preferably particles having a melting point that is higher than the melting point of the solder material by 50° C. or more is used, and more specifically, it is possible to use metal particles such as Cu, Ni and the like, or oxide particles such as $SiO_2$ and the like, or carbide particles such as SiC and the like. Preferably these particles having a high melting point have an average particle size of 1 μm to 70 μm. Moreover, preferably the amount of particles having a high melting point that is included is about 1% by mass to 40% by mass with respect to the solder material.

In a typical die-bonding device, a heater section is provided inside a half sealed chamber having an opening section for supplying solder material and semiconductor elements, and after a substrate is conveyed to this heater section, the substrate is heated. When doing this, an inert gas or a forming gas (gas in which hydrogen is mixed with an inert gas as a reducing gas) is circulated inside the chamber. In this state, together with supplying solder material onto the substrate that has been heated to a specified temperature, the solder material is melted and semiconductor elements are placed on the solder material, then by applying pressure the substrate and the semiconductor elements are bonded.

At this time, the solder material waits in the heater section in a state in which the mixed gas of heated inert gas and air is blown, so oxidation proceeds on the surface of the solder material. Moreover, although inert gas is circulating, the inside of the chamber is not completely sealed, so oxidation also proceeds due to the oxygen that enters into the chamber when the solder material is supplied.

In addition, in order to perform good bonding, the temperature in the heating section must be set to a temperature that is about 30° C. to 70° C. higher than the melting point of the solder material. Particularly, when using solder having a high melting point such as Pb solder material that includes 5% by mass of Sn, the temperature inside the heater section must be set to about 340° C. to 380° C., so oxidation of the solder material advances even more.

In this kind of die bonding, by using the coated solder material of the present invention instead of conventional solder material, the function of the coating film makes it possible to prevent oxidation of the solder material when waiting and when melting. Moreover, the coating film of the coated solder material of the present invention has excellent thermal decomposition, so there is no impairment of the wetting extendability and bondability of the coated solder material due to coating film remaining during melting. In other words, with the coated solder material of the present invention, it is possible to achieve excellent wetting extendability and bondability (bonding strength), and bonding with very few gaps even in production on an industrial scale.

Therefore, the coated solder material of the present invention can be suitably used for semiconductor element bonding substrates and in various kinds of devices that use those substrates.

EXAMPLES

The invention will be explained in further detail below while referencing some examples.

1. Production of Solder Material and Coated Solder Material

First, the solder material that is to be coated was produced. As raw materials, 99.9% pure Bi, Zn, Ag, Sn, Pb, Cu, Au, In, Al, Ni, Sb, Ge, Te and P were prepared. In order to prevent variation in the composition due to sampling location in the solder material to be obtained, large thin pieces and bulk shaped raw material were cut or crushed to adjust the size to 3 mm or less.

A specified amount was measured from the raw material that has been adjusted in this way, and filled into a graphite crucible, and together with placing the crucible into a high-frequency melting furnace, nitrogen was circulated inside the furnace at 0.7 L/min per 1 kg of raw material. In this state, the power to the melting furnace was turned ON, and the raw material was melted while sufficiently stirring with a stirring rod so that there was no variation in the local composition. After making sure that the raw material was sufficiently melted, the power to the melting furnace was turned OFF, the crucible was quickly removed, the obtained molten metal was cast into molds for the solder mother alloy, and solder mother alloy ingots (plate shape having a thickness of 5 mm) having different compositions were made. The molds used were the same as a typical mold that is used when manufacturing a solder mother alloy.

Each of the solder mother alloy ingots was roughly rolled to a thickness of 400 μm using a roller (warm rolling; rolling temperature: 90° C.). Next, finish rolling was performed using a rolling roller having a surface roughness (Ra) of 0.20 μm while adjust the feeding speed for each ingot. Finally, sheet-shaped solder materials 1 to 35 having a width of 25 mm were obtained by cutting with a slitter. The compositions of these solder materials were measured using an ICP atomic emission spectrophotometer (ICPS-8100, manufactured by Shimadzu Corporation). The results are illustrated in Table 1.

TABLE 1

| Solder Material | Composition (% by mass) | | | | | | | | | | | | | |
|---|---|---|---|---|---|---|---|---|---|---|---|---|---|---|
| | Bi | Zn | Ag | Sn | Pb | Cu | Au | In | Ni | Sb | Ge | Si | Te | P |
| 1 | Re | 2.0 | — | 5.0 | — | — | — | — | — | — | — | — | — | — |
| 2 | Re | 2.7 | — | — | — | — | — | — | — | — | — | — | — | — |
| 3 | Re | — | 2.5 | — | — | — | — | — | — | — | — | — | — | — |
| 4 | Re | — | — | 30.0 | — | — | — | — | — | — | — | — | — | — |
| 5 | — | — | — | 3.0 | Re | — | — | — | — | — | — | — | — | — |
| 6 | — | — | — | 5.2 | Re | — | — | — | — | — | — | — | — | — |
| 7 | — | — | — | 10.1 | Re | — | — | — | — | — | — | — | — | — |
| 8 | — | — | 2.5 | 2.0 | Re | — | — | — | — | — | — | — | — | — |
| 9 | — | — | 2.5 | 5.0 | Re | — | — | — | — | — | — | — | — | — |
| 10 | — | — | 2.0 | 10.1 | Re | 0.1 | — | — | — | — | — | — | — | 0.06 |
| 11 | — | — | 2.5 | 2.0 | Re | — | — | 5.1 | — | — | — | — | — | — |
| 12 | — | — | 2.5 | — | Re | — | — | — | — | — | — | — | 0.05 | — |
| 13 | — | — | 2.4 | 2.1 | Re | — | — | — | — | — | — | — | — | — |
| 14 | — | — | 3.5 | Re | — | — | — | — | — | — | — | — | — | — |
| 15 | — | — | 5.0 | Re | — | — | — | — | — | — | — | — | — | — |
| 16 | — | — | 10.1 | Re | — | — | — | — | — | — | — | — | — | — |
| 17 | — | — | 3.5 | Re | — | 0.5 | — | — | 0.06 | — | 0.01 | — | — | — |
| 18 | — | — | — | Re | — | — | — | — | — | 3.5 | — | — | — | — |
| 19 | — | — | — | Re | — | — | — | — | — | 8.5 | — | — | — | — |
| 20 | — | — | — | Re | — | — | — | — | 0.6 | 7.0 | — | — | — | 0.05 |

TABLE 1-continued

| Solder Material | Bi | Zn | Ag | Sn | Pb | Cu | Au | In | Ni | Sb | Ge | Si | Te | P |
|---|---|---|---|---|---|---|---|---|---|---|---|---|---|---|
| 21 | — | — | 3.0 | Re | — | 0.5 | — | — | — | — | — | — | — | — |
| 22 | — | — | 1.0 | Re | — | 0.2 | — | — | — | — | — | — | — | — |
| 23 | — | — | — | — | — | — | Re | — | — | — | 12.2 | — | — | — |
| 24 | — | — | — | 19.9 | — | — | Re | — | — | — | — | — | — | — |
| 25 | — | — | — | — | — | — | Re | — | — | — | — | 1.0 | — | — |
| 26 | — | — | — | — | — | — | Re | — | — | — | — | 2.0 | — | — |
| 27 | — | — | — | — | — | — | Re | — | — | — | — | 3.2 | — | — |
| 28 | — | — | 3.0 | — | — | — | — | Re | — | — | — | — | — | — |
| 29 | — | — | 10.0 | — | — | — | — | Re | — | — | — | — | — | — |
| 30 | — | — | — | 3.0 | — | — | — | Re | — | — | — | — | — | — |
| 31 | — | — | — | 48.2 | — | — | — | Re | — | — | — | — | — | — |
| 32 | — | 2.1 | — | — | — | — | — | Re | — | — | — | — | — | — |
| 33 | — | — | — | — | — | 0.5 | — | Re | — | — | — | — | — | — |
| 34 | — | — | — | — | — | 0.5 | — | Re | — | — | — | — | — | 0.05 |
| 35 | — | 9.0 | — | Re | — | — | — | — | — | — | — | — | — | — |

* Re: Residue

Examples 1 to 110, Comparative Examples 1 to 13

As examples 1 to 110 and comparative examples 1 to 13, samples were prepared by forming a coating film under the conditions given in Table 2 on the surfaces of solder materials 1 to 35 using an atmospheric pressure plasma polymerization device (Plasma Polymer Laboratory Systems, Model PAD-1, manufactured by Plasmatreat GmbH). In these examples and comparative examples, $N_2$ was used as the carrier gas, and together with adjusting the amount of coating material introduced to 20 g/hour, the plasmatization conditions were set as follows:
  Output frequency of the plasma generator: 21 kHz
  Output voltage of the generator: 280V
  Pressure: Atmospheric pressure (1013.25 hPa)
The thickness of the coating film of the obtained coated solder material and the maximum value and minimum value thereof were calculated by preparing the coated solder material so that the cross section could be observed, and then measuring the thickness of the coating film at three arbitrary locations using a TEM (transmission electron microscope HF-2000, Hitachi High-Technologies Corporation).

For the samples of comparative examples 11 and 12, the thicknesses of the coating films were thin and it was not possible to obtain sufficient resistance to oxidation. Therefore, for these comparative examples, evaluations b) to d) of the evaluation items described later were not performed.

Moreover, in examples 1 to 21, 43 to 45, 49 to 57, 67 to 75, 85 to 89, 95 to 101 and 109, and comparative examples 1 to 6 that used hydrocarbon gas as the coating material, scattering of hydrocarbon gas was prevented by local exhaust equipment when mixing the hydrocarbon gas with the carrier gas. On the other hand, in examples 22 to 42, 46 to 48, 58 to 66, 76 to 84, s90 to 94, 102 to 108 and 110, and comparative examples 7 to 12 in which hydrocarbon solvent was used as the coating material, conditions such as the pressure and temperature were suitably adjusted so that the volatile state of the hydrocarbon solvent could be maintained.

Comparative Example 14

As comparative example 14, a sample on which a coating film was formed was prepared by immersing solder material 1 for 10 minutes in a silicon coating agent (APZ6601, manufactured by Dow Corning Toray Co., Ltd.) and then drying for 10 minutes at 120° C.

Comparative Example 15

As comparative example 15, a sample on which a coating film was formed was prepared by immersing solder material 1 for 10 minutes in a fluorine coating agent (FG-30020C30, manufactured by Fluoro Technology) and then drying for 10 minutes in a cold wind.

Comparative Examples 16 to 51

As comparative examples 16 to 51, samples were prepared of which coating film was not formed on the surfaces of solder materials 1 to 35.

2. Evaluation

Evaluations a) to d) below were performed for each of the samples. The results are given in Table 2.

a) Evaluation of Resistance to Oxidation

The resistance to oxidation of each of the samples was evaluated by observing the state of the surface using an optical microscope (ECLPEM6600, manufactured by Nikon Corporation).

First, the state of the surfaces of the samples were observed in the initial state (before coating) and after coating for each of the samples in Examples 1 to 110 and Comparative Examples 1 to 15. The results are evaluated as "Good" when the state of the surfaces after coating were the same as the initial state of the surfaces, and were evaluated as "Bad" when compared with the initial state of the surfaces, worsened discoloration and smoothness were confirmed.

Moreover, a neutral salt spay test (complying to JISZ2371) was performed for 7 days on all of the samples, and the state of the surfaces was observed. The results are evaluated as "Good" when the state of the surfaces after coating was the same as the initial state of the surfaces, and were evaluated as "Bad" when compared with the initial state of the surfaces, worsened discoloration and smoothness were confirmed.

b) Evaluation of Thermal Decomposition

The thermal decomposition of the coating films that were formed on the samples in Examples 1 to 110 and Comparative Examples 1 to 10 and 13 to 15 were evaluated by measuring the mass before coating each sample, and before and after heating after coating. More specifically, the mass $W_0$ before coating, the mass $W_1$ after coating and before heating, and the mass $W_2$ after being heated at 200° C., melted, and cooled to room temperature were measured for the samples in Examples 1 to 110 and Comparative Examples 1 to 10 and 13 to 15. From these measurement results the mass $w_1$ ($=W_1-W_0$) of the coating film before heating, and the mass $w_2$ ($=W_2-W_0$) of the coating film after heating were found, and the mass-reduction rates a before and after heating ($=(w_1-w_2)/w_1 \times 100$) were found. The results were evaluated as being "Good" when the mass-reduction rate α was 80% by mass or greater, "Passing" when the mass-reduction rate α was no less than 60% by mass but less than 80% by mass, and "Bad" when the mass-reduction rate a was less than 60% by mass. This evaluation was not performed on samples on which a coating film was not formed (Comparative Examples 16 to 51).

c) Evaluation of Wettability

The wettability (wetting extendability, bondability and whether or not there are gaps) was evaluated for the samples in Examples 1 to 110, and Comparative Example 1 to 10 and 13 to 51 by using an atmosphere-controlled wettability tester (manufactured by Sumitomo Metal Mining Co., Ltd.).

First, a double cover was placed on the heater section of the atmosphere-controlled wettability tester, then the heater temperature was set to a temperature 50° C. higher than the melting point and heated while nitrogen flowed into the heater from 4 locations at a flow rate of 12 L/min, and after the heater temperature was confirmed to be stable, a Cu substrate (plate thickness: approx. 0.70 mm) was placed in the heater section and heated for 25 seconds.

At the same time, test pieces having a length in the axial direction of 3 cm to 5 cm were cut from each sample that was processed into a wire shape having an outer diameter of 0.5 mm, and after standing a test piece on the Cu substrate, heating was performed for another 25 seconds. After heating was complete, the Cu substrate was removed from the heater section, and cooled to room temperature in a nitrogen atmosphere. After confirming that the Cu substrate has sufficiently cooled, the boundary (bonding surface) between the test piece and Cu substrate was visually observed. Moreover, this Cu substrate was embedded in resin, and after cutting and polishing, the bonding surface was visually observed.

The results were evaluated as being "Good" when the Cu substrate and test piece were bonded, the wetting extendability of a test piece was good (the test piece was thinly wetted) and there were no gaps, and "Bad" when there was bonding, but the wetting extendability of the test piece was insufficient (when the test piece was raised), or when there were gaps, and "Failure" when bonding was not possible.

Moreover, the effect on the wetting extendability of the coating film was evaluated for the samples in Examples 1 to 110 and Comparative Examples 1 to 10 and 13 to 15. More specifically, the wetting extendability $X_R$ in the uncoated state and the wetting extendability $X_m$ in the state in which a coating film is formed were measured for test pieces that were cut from each of these samples, and the effects were evaluated by calculating the ratio of $X_m$ with respect to $X_R$ ($X_m/X_R$). In this evaluation, the outer diameter r of samples before heating and the outer diameter d of test pieces after being bonded to the Cu substrate were calculated based on measurement values by a microscope (Measuring Microscope NM-40, manufactured by Nikon Corporation). The results were evaluated as being "Excellent" when the ratio $X_m/X_R$ was in the range of being no less than 1.20 and no greater than 1.45, "Good" when in the range of being no less than 1.05 and no greater than 1.60 (except when in that range of being no less than 1.20 and no greater than 1.45), "Passing" when in the range of being greater than 0.90 and less than 1.05, and "Failure" when greater than 1.60.

d) Evaluation of Durability

The durability (heat resistance) of the samples in Examples 1 to 110, and Comparative Example 1 to 10 and 13 to 51 were evaluated by performing a heat-cycle test. More specifically, one test piece was separately prepared for each test piece that could be bonded to the Cu substrate in the wettability evaluation (test pieces for which the wettability was evaluated as "Good" and "Bad"), and heat-cycle testing of 500 cycles was performed on the substrate, with one heat-cycle being cooling to −55° C. and heating to +150° C.

After the test, the solder material together with the Cu substrate was embedded in resin, and after cutting a cross section and polishing, the bonding surface was observed using a SEM (scanning electron microscope S-4800, manufactured by Hitachi High-Technologies Corporation). The results were evaluated as "Good" when the bonding surface was maintained the same as before the test, and "Bad" when pealing or cracking of the bonding surface occurred.

TABLE 2

[Solder Material 1: Bi Solder Material (1)]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 1 | 1 | $N_2$ | $C_2H_2$ | 5 | 1 | 1 | 20 | 4.0 | Good | Good | Passing | Good | Excellent | Good |
| Ex 2 | 1 | $N_2$ | $C_2H_2$ | 5 | 20 | 1 | 16 | 5.0 | Good | Good | Passing | Good | Excellent | Good |
| Ex 3 | 1 | $N_2$ | $C_2H_2$ | 5 | 40 | 1 | 14 | 5.5 | Good | Good | Passing | Good | Excellent | Good |
| Ex 4 | 1 | $N_2$ | $C_2H_2$ | 10 | 1 | 1 | 17 | 4.2 | Good | Good | Passing | Good | Excellent | Good |
| Ex 5 | 1 | $N_2$ | $C_2H_2$ | 10 | 20 | 1 | 14 | 3.5 | Good | Good | Passing | Good | Excellent | Good |
| Ex 6 | 1 | $N_2$ | $C_2H_2$ | 10 | 40 | 1 | 12 | 4.0 | Good | Good | Passing | Good | Excellent | Good |
| Ex 7 | 1 | $N_2$ | $C_2H_2$ | 20 | 1 | 1 | 10 | 2.5 | Good | Good | Passing | Good | Good | Good |
| Ex 8 | 1 | $N_2$ | $C_2H_2$ | 20 | 20 | 1 | 7 | 3.0 | Good | Good | Passing | Good | Good | Good |
| Ex 9 | 1 | $N_2$ | $C_2H_2$ | 20 | 40 | 1 | 5 | 2.5 | Good | Good | Good | Good | Good | Good |
| Ex 10 | 1 | $N_2$ | $C_2H_2$ | 30 | 1 | 1 | 7 | 2.8 | Good | Good | Good | Good | Good | Good |
| Ex 11 | 1 | $N_2$ | $C_2H_2$ | 30 | 10 | 1 | 5 | 1.8 | Good | Good | Good | Good | Good | Good |
| Ex 12 | 1 | $N_2$ | $C_2H_2$ | 30 | 20 | 1 | 4.5 | 1.5 | Good | Good | Good | Good | Good | Good |
| Ex 13 | 1 | $N_2$ | $C_2H_2$ | 5 | 1 | 2 | 40 | 6.8 | Good | Good | Passing | Good | Good | Good |
| Ex 14 | 1 | $N_2$ | $C_2H_2$ | 5 | 1 | 5 | 98 | 7.3 | Good | Good | Passing | Good | Good | Good |

TABLE 2-continued

[Solder Material 1: Bi Solder Material (1)]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 15 | 1 | $N_2$ | $C_2H_2$ | 5 | 1 | 7 | 138 | 8.2 | Good | Good | Passing | Good | Good | Good |
| Ex 16 | 1 | $N_2$ | $C_2H_2$ | 5 | 1 | 10 | 190 | 9.8 | Good | Good | Passing | Good | Good | Good |
| Ex 17 | 1 | $O_2$ | $C_2H_2$ | 5 | 10 | 1 | 18 | 3.2 | Good | Good | Passing | Good | Good | Good |
| Ex 18 | 1 | Air | $C_2H_2$ | 5 | 10 | 1 | 16 | 4.1 | Good | Good | Passing | Good | Good | Good |
| Ex 19 | 1 | $N_2$ | $CH_4$ | 5 | 1 | 1 | 16 | 4.5 | Good | Good | Passing | Good | Good | Good |
| Ex 20 | 1 | $N_2$ | $C_3H_8$ | 5 | 1 | 1 | 22 | 5.8 | Good | Good | Passing | Good | Good | Good |
| Ex 21 | 1 | $N_2$ | $C_4H_{10}$ | 5 | 1 | 1 | 26 | 6.5 | Good | Good | Passing | Good | Good | Good |

*Ex: Example;
$C_2H_2$: Acetylene;
$CH_4$: Methane;
$C_3H_8$: Propane;
$C_4H_{10}$: Butane

TABLE 3

[Solder Material 1: Bi Solder Material (2)]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 22 | 1 | $N_2$ | $C_6H_{14}$ | 5 | 1 | 1 | 22 | 4.3 | Good | Good | Passing | Good | Excellent | Good |
| Ex 23 | 1 | $N_2$ | $C_6H_{14}$ | 5 | 20 | 1 | 16 | 3.9 | Good | Good | Passing | Good | Excellent | Good |
| Ex 24 | 1 | $N_2$ | $C_6H_{14}$ | 5 | 40 | 1 | 14 | 4.3 | Good | Good | Passing | Good | Excellent | Good |
| Ex 25 | 1 | $N_2$ | $C_6H_{14}$ | 10 | 1 | 1 | 17 | 4.5 | Good | Good | Passing | Good | Excellent | Good |
| Ex 26 | 1 | $N_2$ | $C_6H_{14}$ | 10 | 20 | 1 | 15 | 4.0 | Good | Good | Passing | Good | Excellent | Good |
| Ex 27 | 1 | $N_2$ | $C_6H_{14}$ | 10 | 40 | 1 | 12 | 4.3 | Good | Good | Passing | Good | Excellent | Good |
| Ex 28 | 1 | $N_2$ | $C_6H_{14}$ | 20 | 1 | 1 | 10 | 3.5 | Good | Good | Passing | Good | Good | Good |
| Ex 29 | 1 | $N_2$ | $C_6H_{14}$ | 20 | 20 | 1 | 8 | 3.9 | Good | Good | Passing | Good | Good | Good |
| Ex 30 | 1 | $N_2$ | $C_6H_{14}$ | 20 | 40 | 1 | 5 | 1.8 | Good | Good | Good | Good | Good | Good |
| Ex 31 | 1 | $N_2$ | $C_6H_{14}$ | 30 | 1 | 1 | 7 | 3.0 | Good | Good | Good | Good | Good | Good |
| Ex 32 | 1 | $N_2$ | $C_6H_{14}$ | 30 | 10 | 1 | 5 | 2.6 | Good | Good | Good | Good | Good | Good |
| Ex 33 | 1 | $N_2$ | $C_6H_{14}$ | 30 | 20 | 1 | 4.3 | 1.3 | Good | Good | Good | Good | Good | Good |
| Ex 34 | 1 | $N_2$ | $C_6H_{14}$ | 5 | 1 | 2 | 40 | 7.2 | Good | Good | Passing | Good | Good | Good |
| Ex 35 | 1 | $N_2$ | $C_6H_{14}$ | 5 | 1 | 5 | 98 | 8.5 | Good | Good | Passing | Good | Good | Good |
| Ex 36 | 1 | $N_2$ | $C_6H_{14}$ | 5 | 1 | 7 | 137 | 8.3 | Good | Good | Passing | Good | Good | Good |
| Ex 37 | 1 | $N_2$ | $C_6H_{14}$ | 5 | 1 | 10 | 190 | 9.7 | Good | Good | Passing | Good | Good | Good |
| Ex 38 | 1 | $O_2$ | $C_6H_{14}$ | 5 | 10 | 1 | 18 | 3.6 | Good | Good | Passing | Good | Good | Good |
| Ex 39 | 1 | Air | $C_6H_{14}$ | 5 | 10 | 1 | 16 | 3.5 | Good | Good | Passing | Good | Good | Good |
| Ex 40 | 1 | $N_2$ | $C_5H_{12}$ | 5 | 1 | 1 | 22 | 6.7 | Good | Good | Passing | Good | Good | Good |
| Ex 41 | 1 | $N_2$ | $C_8H_{16}$ | 5 | 1 | 1 | 14 | 4.3 | Good | Good | Passing | Good | Good | Good |
| Ex 42 | 1 | $N_2$ | $C_6H_{12}O$ | 5 | 1 | 1 | 13 | 5.5 | Good | Good | Passing | Good | Excellent | Good |

*Ex: Example;
$C_6H_{14}$: n-Hexane;
$C_5H_{12}$: Isopentane;
$C_8H_{16}$: Cyclooctane;
$C_6H_{12}O$: Cyclohexanol

TABLE 4

[Solder Material 1: Bi Solder Material (3)]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| CE 1 | 1 | $N_2$ | $C_2H_2$ | 30 | 40 | 1 | 3 | 2.5 | Good | Bad | Good | Bad | Passing | Good |
| CE 2 | 1 | $N_2$ | $C_2H_2$ | 40 | 30 | 1 | 2 | 1.8 | Good | Bad | Good | Bad | Passing | Good |
| CE 3 | 1 | $N_2$ | $C_2H_2$ | 30 | 40 | 1 | 2 | 1.2 | Good | Bad | Good | Bad | Passing | Good |
| CE 4 | 1 | $N_2$ | $C_2H_2$ | 5 | 1 | 12 | 228 | 13.8 | Bad | Good | Passing | Bad | Passing | Bad |

TABLE 4-continued

[Solder Material 1: Bi Solder Material (3)]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| CE 5 | 1 | $N_2$ | $C_2H_2$ | 10 | 1 | 12 | 220 | 15.7 | Bad | Good | Passing | Bad | Passing | Bad |
| CE 6 | 1 | $N_2$ | $C_6H_{14}$ | 30 | 40 | 1 | 3 | 1.8 | Good | Bad | Good | Bad | Passing | Good |
| CE 7 | 1 | $N_2$ | $C_6H_{14}$ | 40 | 30 | 1 | 2 | 1.5 | Good | Bad | Good | Bad | Passing | Good |
| CE 8 | 1 | $N_2$ | $C_6H_{14}$ | 30 | 40 | 1 | 3 | 2.2 | Good | Bad | Good | Bad | Passing | Good |
| CE 9 | 1 | $N_2$ | $C_6H_{14}$ | 5 | 1 | 12 | 228 | 14.5 | Bad | Good | Passing | Bad | Passing | Bad |
| CE 10 | 1 | $N_2$ | $C_6H_{14}$ | 10 | 1 | 12 | 220 | 17.9 | Bad | Good | Passing | Bad | Passing | Bad |
| CE 11 | 1 | $N_2$ | $C_4H_{10}O$ | 5 | 1 | 1 | <1 | — | Good | Bad | — | — | — | — |
| CE 12 | 1 | $N_2$ | $C_{10}H_{20}$ | 5 | 1 | 1 | 2 | 1.8 | Good | Bad | — | — | — | — |
| CE 13 | 1 | $N_2$ | $C_6H_{18}OSi_2$ | 10 | 20 | 1 | 13 | 4.6 | Good | Good | Bad | Bad | Bad | Good |
| CE 14 | 1 | — | Si | — | — | — | 11000 | 5000 | Good | Bad | Bad | Failure | Failure | Bad |
| CE 15 | 1 | — | F | — | — | — | 72100 | 52090 | Good | Good | Passing | Failure | Failure | Bad |
| CE 16 | 1 | — | — | — | — | — | — | — | — | Bad | — | Good | — | Good |

*CE: Comparative Example;
$C_2H_2$: Acetylene;
$C_6H_{14}$: n-Hexane;
$C_4H_{10}O$: Butanol;
$C_{10}H_{20}$: Cyclodecane;
$C_6H_{18}OSi_2$: Hexamethyldisiloxane

TABLE 5

[Solder Materials 2 to 4: Bi—Sn Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 43 | 2 | $N_2$ | $C_2H_2$ | 10 | 20 | 1 | 14 | 4.3 | Good | Good | Passing | Good | Excellent | Good |
| Ex 44 | 3 | $N_2$ | $C_2H_2$ | 10 | 20 | 1 | 13 | 3.5 | Good | Good | Passing | Good | Excellent | Good |
| Ex 45 | 4 | $N_2$ | $C_2H_2$ | 10 | 20 | 1 | 14 | 5.6 | Good | Good | Passing | Good | Excellent | Good |
| Ex 46 | 2 | $N_2$ | $C_6H_{14}$ | 10 | 20 | 1 | 12 | 4.0 | Good | Good | Passing | Good | Excellent | Good |
| Ex 47 | 3 | $N_2$ | $C_6H_{14}$ | 10 | 20 | 1 | 13 | 4.7 | Good | Good | Passing | Good | Excellent | Good |
| Ex 48 | 4 | $N_2$ | $C_6H_{14}$ | 10 | 20 | 1 | 13 | 5.3 | Good | Good | Passing | Good | Excellent | Good |
| CE 17 | 2 | — | — | — | — | — | — | — | — | Bad | — | Good | — | Good |
| CE 18 | 3 | — | — | — | — | — | — | — | — | Bad | — | Good | — | Good |
| CE 19 | 4 | — | — | — | — | — | — | — | — | Bad | — | Good | — | Good |

*Ex: Example;
CE: Comparative Example;
$C_2H_2$: Acetylene;
$C_6H_{14}$: n-Hexane

TABLE 6-1

[Solder Materials 5 to 13: Pb Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 49 | 5 | $N_2$ | $C_2H_2$ | 10 | 20 | 1 | 15 | 5.7 | Good | Good | Passing | Good | Excellent | Good |
| Ex 50 | 6 | $N_2$ | $C_2H_2$ | 10 | 20 | 1 | 13 | 3.8 | Good | Good | Passing | Good | Excellent | Good |
| Ex 51 | 7 | $N_2$ | $C_2H_2$ | 10 | 20 | 1 | 14 | 3.7 | Good | Good | Passing | Good | Excellent | Good |
| Ex 52 | 8 | $N_2$ | $C_2H_2$ | 10 | 20 | 1 | 14 | 4.5 | Good | Good | Passing | Good | Excellent | Good |
| Ex 53 | 9 | $N_2$ | $C_2H_2$ | 10 | 20 | 1 | 14 | 5.0 | Good | Good | Passing | Good | Excellent | Good |
| Ex 54 | 10 | $N_2$ | $C_2H_2$ | 10 | 20 | 1 | 14 | 4.8 | Good | Good | Passing | Good | Excellent | Good |
| Ex 55 | 11 | $N_2$ | $C_2H_2$ | 10 | 20 | 1 | 14 | 3.3 | Good | Good | Passing | Good | Excellent | Good |
| Ex 56 | 12 | $N_2$ | $C_2H_2$ | 10 | 20 | 1 | 14 | 3.9 | Good | Good | Passing | Good | Excellent | Good |
| Ex 57 | 13 | $N_2$ | $C_2H_2$ | 10 | 20 | 1 | 14 | 4.5 | Good | Good | Passing | Good | Excellent | Good |
| Ex 58 | 5 | $N_2$ | $C_6H_{14}$ | 10 | 20 | 1 | 16 | 5.0 | Good | Good | Passing | Good | Excellent | Good |
| Ex 59 | 6 | $N_2$ | $C_6H_{14}$ | 10 | 20 | 1 | 13 | 3.9 | Good | Good | Passing | Good | Excellent | Good |

TABLE 6-1-continued

[Solder Materials 5 to 13: Pb Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 60 | 7 | $N_2$ | $C_6H_{14}$ | 10 | 20 | 1 | 13 | 4.5 | Good | Good | Passing | Good | Excellent | Good |
| Ex 61 | 8 | $N_2$ | $C_6H_{14}$ | 10 | 20 | 1 | 14 | 4.1 | Good | Good | Passing | Good | Excellent | Good |
| Ex 62 | 9 | $N_2$ | $C_6H_{14}$ | 10 | 20 | 1 | 12 | 3.8 | Good | Good | Passing | Good | Excellent | Good |
| Ex 63 | 10 | $N_2$ | $C_6H_{14}$ | 10 | 20 | 1 | 14 | 4.3 | Good | Good | Passing | Good | Excellent | Good |
| Ex 64 | 11 | $N_2$ | $C_6H_{14}$ | 10 | 20 | 1 | 11 | 3.6 | Good | Good | Passing | Good | Excellent | Good |
| Ex 65 | 12 | $N_2$ | $C_6H_{14}$ | 10 | 20 | 1 | 13 | 4.7 | Good | Good | Passing | Good | Excellent | Good |
| Ex 66 | 13 | $N_2$ | $C_6H_{14}$ | 10 | 20 | 1 | 14 | 4.5 | Good | Good | Passing | Good | Excellent | Good |

*Ex: Example;
CE: Comparative Example;
$C_2H_2$: Acetylene;
$C_6H_{14}$: n-Hexiane

TABLE 6-2

[Solder Materials 5 to 13: Pb Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| CE 20 | 5 | — | — | — | — | — | — | — | — | Bad | — | Good | — | Good |
| CE 21 | 6 | — | — | — | — | — | — | — | — | Bad | — | Good | — | Good |
| CE 22 | 7 | — | — | — | — | — | — | — | — | Bad | — | Good | — | Good |
| CE 23 | 8 | — | — | — | — | — | — | — | — | Bad | — | Good | — | Good |
| CE 24 | 9 | — | — | — | — | — | — | — | — | Bad | — | Good | — | Good |
| CE 25 | 9 | — | — | — | — | — | — | — | — | Bad | — | Good | — | Good |
| CE 26 | 10 | — | — | — | — | — | — | — | — | Bad | — | Good | — | Good |
| CE 27 | 11 | — | — | — | — | — | — | — | — | Bad | — | Good | — | Good |
| CE 28 | 12 | — | — | — | — | — | — | — | — | Bad | — | Good | — | Good |
| CE 29 | 13 | | | | | | | | | Bad | | Good | | Good |

*Ex: Example;
CE: Comparative Example;
$C_2H_2$: Acetylene;
$C_6H_{14}$: n-Hexiane

TABLE 7-1

[Solder Materials 14 to 22: Si Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 67 | 14 | $N_2$ | $C_2H_2$ | 10 | 20 | 1 | 13 | 4.2 | Good | Good | Passing | Good | Excellent | Good |
| Ex 68 | 15 | $N_2$ | $C_2H_2$ | 10 | 20 | 1 | 14 | 6.1 | Good | Good | Passing | Good | Excellent | Good |
| Ex 69 | 16 | $N_2$ | $C_2H_2$ | 10 | 20 | 1 | 14 | 5.8 | Good | Good | Passing | Good | Excellent | Good |
| Ex 70 | 17 | $N_2$ | $C_2H_2$ | 10 | 20 | 1 | 15 | 6.3 | Good | Good | Passing | Good | Excellent | Good |
| Ex 71 | 18 | $N_2$ | $C_2H_2$ | 10 | 20 | 1 | 14 | 3.8 | Good | Good | Passing | Good | Excellent | Good |
| Ex 72 | 19 | $N_2$ | $C_2H_2$ | 10 | 20 | 1 | 13 | 4.5 | Good | Good | Passing | Good | Excellent | Good |
| Ex 73 | 20 | $N_2$ | $C_2H_2$ | 10 | 20 | 1 | 14 | 5.5 | Good | Good | Passing | Good | Excellent | Good |
| Ex 74 | 21 | $N_2$ | $C_2H_2$ | 10 | 20 | 1 | 14 | 6.0 | Good | Good | Passing | Good | Excellent | Good |
| Ex 75 | 22 | $N_2$ | $C_2H_2$ | 10 | 20 | 1 | 14 | 5.0 | Good | Good | Passing | Good | Excellent | Good |
| Ex 76 | 14 | $N_2$ | $C_6H_{14}$ | 10 | 20 | 1 | 13 | 5.2 | Good | Good | Passing | Good | Excellent | Good |
| Ex 77 | 15 | $N_2$ | $C_6H_{14}$ | 10 | 20 | 1 | 12 | 3.3 | Good | Good | Passing | Good | Excellent | Good |
| Ex 78 | 16 | $N_2$ | $C_6H_{14}$ | 10 | 20 | 1 | 16 | 7.1 | Good | Good | Passing | Good | Excellent | Good |
| Ex 79 | 17 | $N_2$ | $C_6H_{14}$ | 10 | 20 | 1 | 15 | 4.3 | Good | Good | Passing | Good | Excellent | Good |
| Ex 80 | 18 | $N_2$ | $C_6H_{14}$ | 10 | 20 | 1 | 14 | 5.3 | Good | Good | Passing | Good | Excellent | Good |
| Ex 81 | 19 | $N_2$ | $C_6H_{14}$ | 10 | 20 | 1 | 13 | 4.6 | Good | Good | Passing | Good | Excellent | Good |
| Ex 82 | 20 | $N_2$ | $C_6H_{14}$ | 10 | 20 | 1 | 12 | 4.0 | Good | Good | Passing | Good | Excellent | Good |

TABLE 7-1-continued

[Solder Materials 14 to 22: Si Solder Material]

| Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|
| Ex 83 | 21 | $N_2$ | $C_6H_{14}$ | 10 | 20 | 1 | 14 | 5.0 | Good | Good | Passing | Good | Excellent | Good |
| Ex 84 | 22 | $N_2$ | $C_6H_{14}$ | 10 | 20 | 1 | 12 | 3.5 | Good | Good | Passing | Good | Excellent | Good |

*Ex: Example;
CE: Comparative Example;
$C_2H_2$: Acetylene;
$C_6H_{14}$: n-Hexiane

TABLE 7-2

[Solder Materials 14 to 22: Si Solder Material]

| Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|
| CE 30 | 14 | — | — | — | — | — | — | — | — | Bad | — | Good | — | Good |
| CE 31 | 15 | — | — | — | — | — | — | — | — | Bad | — | Good | — | Good |
| CE 32 | 16 | — | — | — | — | — | — | — | — | Bad | — | Good | — | Good |
| CE 33 | 17 | — | — | — | — | — | — | — | — | Bad | — | Good | — | Good |
| CE 34 | 18 | — | — | — | — | — | — | — | — | Bad | — | Good | — | Good |
| CE 35 | 19 | — | — | — | — | — | — | — | — | Bad | — | Good | — | Good |
| CE 36 | 20 | — | — | — | — | — | — | — | — | Bad | — | Good | — | Good |
| CE 37 | 21 | — | — | — | — | — | — | — | — | Bad | — | Good | — | Good |
| CE 38 | 22 | — | — | — | — | — | — | — | — | Bad | — | Good | — | Good |

*Ex: Example;
CE: Comparative Example;
$C_2H_2$: Acetylene;
$C_6H_{14}$: n-Hexiane

TABLE 8

[Solder Materials 23 to 27: Au Solder Material]

| Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|
| Ex 85 | 23 | $N_2$ | $C_2H_2$ | 10 | 20 | 1 | 14 | 3.6 | Good | Good | Passing | Good | Good | Good |
| Ex 86 | 24 | $N_2$ | $C_2H_2$ | 10 | 20 | 1 | 14 | 3.3 | Good | Good | Passing | Good | Good | Good |
| Ex 87 | 25 | $N_2$ | $C_2H_2$ | 10 | 20 | 1 | 13 | 3.8 | Good | Good | Passing | Good | Good | Good |
| Ex 88 | 26 | $N_2$ | $C_2H_2$ | 10 | 20 | 1 | 14 | 4.0 | Good | Good | Passing | Good | Good | Good |
| Ex 89 | 27 | $N_2$ | $C_2H_2$ | 10 | 20 | 1 | 14 | 3.5 | Good | Good | Passing | Good | Good | Good |
| Ex 90 | 23 | $N_2$ | $C_6H_{14}$ | 10 | 20 | 1 | 12 | 5.1 | Good | Good | Passing | Good | Good | Good |
| Ex 91 | 24 | $N_2$ | $C_6H_{14}$ | 10 | 20 | 1 | 14 | 3.7 | Good | Good | Passing | Good | Good | Good |
| Ex 92 | 25 | $N_2$ | $C_6H_{14}$ | 10 | 20 | 1 | 13 | 4.0 | Good | Good | Passing | Good | Good | Good |
| Ex 93 | 26 | $N_2$ | $C_6H_{14}$ | 10 | 20 | 1 | 14 | 4.5 | Good | Good | Passing | Good | Good | Good |
| Ex 94 | 27 | $N_2$ | $C_6H_{14}$ | 10 | 20 | 1 | 11 | 4.1 | Good | Good | Passing | Good | Good | Good |
| CE 39 | 23 | — | — | — | — | — | — | — | — | Bad | — | Bad | — | Good |
| CE 40 | 24 | — | — | — | — | — | — | — | — | Bad | — | Bad | — | Good |
| CE 41 | 25 | — | — | — | — | — | — | — | — | Bad | — | Bad | — | Good |
| CE 42 | 26 | — | — | — | — | — | — | — | — | Bad | — | Bad | — | Good |
| CE 43 | 27 | — | — | — | — | — | — | — | — | Bad | — | Bad | — | Good |

*Ex: Example;
CE: Comparative Example;
$C_2H_2$: Acetylene;
$C_6H_{14}$: n-Hexiane

TABLE 9

[Solder Materials 28 to 34: In Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 95 | 28 | $N_2$ | $C_2H_2$ | 10 | 20 | 1 | 15 | 5.7 | Good | Good | Passing | Good | Good | Good |
| Ex 96 | 29 | $N_2$ | $C_2H_2$ | 10 | 20 | 1 | 14 | 4.5 | Good | Good | Passing | Good | Good | Good |
| Ex 97 | 30 | $N_2$ | $C_2H_2$ | 10 | 20 | 1 | 13 | 3.8 | Good | Good | Passing | Good | Good | Good |
| Ex 98 | 31 | $N_2$ | $C_2H_2$ | 10 | 20 | 1 | 14 | 3.5 | Good | Good | Passing | Good | Good | Good |
| Ex 99 | 32 | $N_2$ | $C_2H_2$ | 10 | 20 | 1 | 12 | 4.1 | Good | Good | Passing | Good | Good | Good |
| Ex 100 | 33 | $N_2$ | $C_2H_2$ | 10 | 20 | 1 | 14 | 4.0 | Good | Good | Passing | Good | Good | Good |
| Ex 101 | 34 | $N_2$ | $C_2H_2$ | 10 | 20 | 1 | 13 | 3.5 | Good | Good | Passing | Good | Good | Good |
| Ex 102 | 28 | $N_2$ | $C_6H_{14}$ | 10 | 20 | 1 | 15 | 6.0 | Good | Good | Passing | Good | Good | Good |
| Ex 103 | 29 | $N_2$ | $C_6H_{14}$ | 10 | 20 | 1 | 12 | 3.5 | Good | Good | Passing | Good | Good | Good |
| Ex 104 | 30 | $N_2$ | $C_6H_{14}$ | 10 | 20 | 1 | 13 | 3.8 | Good | Good | Passing | Good | Good | Good |
| Ex 105 | 31 | $N_2$ | $C_6H_{14}$ | 10 | 20 | 1 | 14 | 4.5 | Good | Good | Passing | Good | Good | Good |
| Ex 106 | 32 | $N_2$ | $C_6H_{14}$ | 10 | 20 | 1 | 12 | 3.8 | Good | Good | Passing | Good | Good | Good |
| Ex 107 | 33 | $N_2$ | $C_6H_{14}$ | 10 | 20 | 1 | 16 | 5.5 | Good | Good | Passing | Good | Good | Good |
| Ex 108 | 34 | $N_2$ | $C_6H_{14}$ | 10 | 20 | 1 | 13 | 3.6 | Good | Good | Passing | Good | Good | Good |
| CE 44 | 28 | — | — | — | — | — | — | — | — | Bad | — | Good | — | Good |
| CE 45 | 29 | | | | | | | | | Bad | | Good | | Good |
| CE 46 | 30 | | | | | | | | | Bad | | Good | | Good |
| CE 47 | 31 | | | | | | | | | Bad | | Good | | Good |
| CE 48 | 32 | — | — | — | — | — | — | — | — | Bad | — | Good | — | Good |
| CE 49 | 33 | | | | | | | | | Bad | | Good | | Good |
| CE 50 | 34 | | | | | | | | | Bad | | Good | | Good |

*Ex: Example;
CE: Comparative Example;
$C_2H_2$: Acetylene;
$C_6H_{14}$: n-Hexiane

TABLE 10

[Solder Material 35: Zn—Sn Solder Material]

| | Solder Material | Reaction Gas | Coating Material | Nozzle Distance (mm) | Nozzle Speed (m/min) | Processing Frequency (times) | Film Thickness (nm) Average Value | Film Thickness (nm) Max-Min | Oxidation Resistance After Coating | Oxidation Resistance After Heating | Thermal Decomposition | Wettability | Wetting Extendability ($X_m/X_R$) | Durability |
|---|---|---|---|---|---|---|---|---|---|---|---|---|---|---|
| Ex 109 | 35 | $N_2$ | $C_2H_2$ | 10 | 20 | 1 | 14 | 5.7 | Good | Good | Passing | Good | Excellent | Good |
| Ex 110 | 35 | $N_2$ | $C_6H_{14}$ | 10 | 20 | 1 | 13 | 4.9 | Good | Good | Passing | Good | Excellent | Good |
| CE 51 | 35 | — | — | — | — | — | — | — | — | Bad | — | Good | — | Good |

*Ex: Example;
CE: Comparative Example;
$C_2H_2$: Acetylene;
$C_6H_{14}$: n-Hexiane 3. Evaluation Results From the above, it can be seen that for the coated solder materials of Examples 1 to 110, the thickness of the coating film is within a suitable range, and not only is the thickness highly uniform, but the thermal decomposition is also good. Moreover, it can be seen that when these coated solder materials are compared with the uncoated solder materials (Comparative Examples 16 to 51), not only is there an improvement in resistance to oxidation and wettability, but the durability is also good.

On the other hand, it can be seen that when comparing the coated solder materials of Comparative Examples 1 to 15 with the coated solder materials of Examples 1 to 110, one or more of the resistance to oxidation, wettability and durability is inferior.

What is claimed is:

1. A coated solder material comprising;
   a solder material including a metal and having a surface, and
   a coating film formed on the surface of the solder material;
   the coating film including a carbon compound that is formed by introducing an organic compound having a carbon number of 8 or less together with a carrier gas into a reaction gas that has been plasmatized under atmospheric pressure, and then after a radicalized organic compound has been formed by radicalizing the organic compound, causing the radicalized organic compound to react with the metal on the surface of the solder material to form the carbon compound; and
   the coating film having a thickness of 4 nm to 200 nm, and a mass-reduction rate is 60% or greater after the coating film is heated at 150° C. to 300° C. and melted.

2. The coated solder material according to claim 1, wherein the difference between the maximum value and the minimum value of the thickness of the coating film is 10 nm or less.

3. The coated solder material according to claim 1, wherein when an outer diameter of the solder material that is processed into a wire shape is taken to be r, and when an outer diameter of the solder material that is bonded to a Cu substrate is taken to be d by making the solder material stand up on the Cu substrate that has been heated for 25 seconds at a temperature that is 50° C. higher than a melting point of the solder material, then further heated for another 25 seconds and cooled to a room temperature, and when a ratio of d with respect to r is defined as a wetting extendability X, the ratio of the wetting extendability $X_m$ of the coated solder material formed by coating the solder material with the coating film with respect to the wetting extendability $X_R$ of an uncoated solder material is within a range of 1.05 to 1.60.

4. The coated solder material according to claim 1, wherein the solder material is one kind selected from among a group of Bi solder material, Bi—Sn solder material, Pb solder material, Sn solder material, Au solder material, In solder material, or Zn—Sn solder material.

* * * * *